(12) United States Patent
Mohammed et al.

(10) Patent No.: US 8,110,445 B2
(45) Date of Patent: Feb. 7, 2012

(54) HIGH POWER CERAMIC ON COPPER PACKAGE

(75) Inventors: Anwar A. Mohammed, San Jose, CA (US); Soon Ing Chew, Milpitas, CA (US); Donald Fowlkes, San Jose, CA (US)

(73) Assignee: Infineon Technologies AG, Neubiberg (DE)

( * ) Notice: Subject to any disclaimer, the term of this patent is extended or adjusted under 35 U.S.C. 154(b) by 244 days.

(21) Appl. No.: 12/436,652

(22) Filed: May 6, 2009

(65) Prior Publication Data

US 2010/0283134 A1    Nov. 11, 2010

(51) Int. Cl.
*H01L 21/44* (2006.01)

(52) U.S. Cl. .................. 438/122; 257/E21.499

(58) Field of Classification Search .......... 438/121–127, 438/118–119, 111; 257/E21.499
See application file for complete search history.

(56) References Cited

U.S. PATENT DOCUMENTS

| | | | |
|---|---|---|---|
| 4,227,036 A | 10/1980 | Fitzgerald | |
| 4,897,508 A * | 1/1990 | Mahulikar et al. | 174/522 |
| 5,228,974 A | 7/1993 | Kiesele et al. | |
| 5,490,627 A | 2/1996 | Krum et al. | |
| 5,798,566 A | 8/1998 | Sato et al. | |
| 5,886,407 A | 3/1999 | Polese et al. | |
| 5,972,737 A | 10/1999 | Polese et al. | |
| 6,462,413 B1 | 10/2002 | Polese et al. | |
| 6,511,866 B1 | 1/2003 | Bregante et al. | |
| 2007/0029664 A1 | 2/2007 | Mohammed et al. | |
| 2010/0117219 A1 * | 5/2010 | Oka et al. | 257/693 |

* cited by examiner

*Primary Examiner* — Hoa B Trinh
(74) *Attorney, Agent, or Firm* — Murphy, Bilak & Homiller, PLLC

(57) ABSTRACT

According to an embodiment of a high power package, the package includes a copper heat sink, a ceramic lead frame and a semiconductor chip. The copper heat sink has a thermal conductivity of at least 350 W/mK. The ceramic lead frame is attached to the copper heat sink with an epoxy. The semiconductor chip is attached to the copper heat sink on the same side as the lead frame with an electrically conductive material having a melting point of about 280° C. or greater.

18 Claims, 7 Drawing Sheets

HIGH POWER CERAMIC ON COPPER PACKAGE

BACKGROUND

Many types of semiconductor devices are used in high power applications, requiring robust and reliable packaging. A high power package typically includes a semiconductor chip, a heat sink and a lead frame. The lead frame enables external electrical connections to be made to the semiconductor chip while electrically isolating the connections from the heat sink. The lead frame is typically made of a ceramic material such as alumina. The lead frame is conventionally brazed to the heat sink at a relatively high temperature, e.g. around 800° or higher so that the interface between the heat sink and the lead frame can withstand extreme temperature conditions during use in the field.

Ideally, the heat sink would be made from essentially all copper which has a high thermal conductivity (385 W/mK). Such a heat sink would enable the package to efficiently dissipate large amounts of waste heat energy generated by the semiconductor chip. However, high brazing temperatures preclude the use of a mostly copper heat sink because copper has a CTE (coefficient of thermal expansion) of about 17 ppm and an alumina lead frame has a CTE of about 7 ppm. The CTE mismatch between a high-copper content heat sink and a ceramic lead frame would result in the heat sink expanding and contracting much more than the lead frame during the brazing process, resulting in heat sink bowing and damage to the package.

For this reason, conventional high power packages typically use a heat sink formed from a metal matrix composite material such as CuMoCu, CuTg, WCu, etc. Metal matrix composite materials have a lower CTE than copper. The lower CTE of the metal matrix composite material more closely matches the CTE of a ceramic substrate, reducing the amount of stress-induced damage caused during brazing. However, metal matrix composite materials such as CuMoCu, CuTg, WCu and the like have a much lower thermal conductivity than copper. For example, CuMoCu has a thermal conductivity of about 260 W/mK and CuTg has an even lower thermal conductivity of about 180 W/mK, both significantly lower than that of copper (385 W/mK). Such low thermal conductivity values degrade the overall thermal performance of the package which can be catastrophic for high power applications.

SUMMARY

According to an embodiment of a high power package, the package includes a copper heat sink, a ceramic lead frame and a semiconductor chip. The copper heat sink has a thermal conductivity of at least 350 W/mK. The ceramic lead frame is attached to the copper heat sink with an epoxy. The semiconductor chip is attached to the copper heat sink on the same side as the lead frame with an electrically conductive material having a melting point of about 280° C. or greater.

According to one embodiment of a method for manufacturing a high power package, a copper heat sink having a predetermined bow is attached to a ceramic lead frame with an epoxy. A semiconductor chip is attached to the copper heat sink on the same side as the ceramic lead frame so that the ceramic lead frame at least partly surrounds the semiconductor chip. The ceramic lead frame and the semiconductor chip are attached to the copper heat sink under conditions that impart a bow on the copper heat sink which counteracts the predetermined bow so that the side of the copper heat sink attached to the ceramic lead frame becomes generally planar.

According to another embodiment of a method for manufacturing a high power package, a copper heat sink is bowed by a predetermined amount. The predetermined amount of bowing is sufficient to counteract a bow imparted to the heat sink during subsequent processing so that the copper heat sink is generally planar after a ceramic lead frame and a semiconductor chip are attached to the heat sink. The ceramic lead frame is attached to the copper heat sink with an epoxy and the semiconductor chip is attached to the same side of the copper heat sink as the ceramic lead frame.

According to yet another embodiment of a method for manufacturing a high power package, a copper heat sink having a predetermined bow is provided. The predetermined bow is sufficient to counteract a bow imparted to the copper heat sink during subsequent processing so that the copper heat sink is generally planar after a ceramic lead frame and a semiconductor chip are attached to the copper heat sink. The ceramic lead frame is attached to the copper heat sink with an epoxy and the semiconductor chip is attached to the same side of the copper heat sink as the ceramic lead frame.

Those skilled in the art will recognize additional features and advantages upon reading the following detailed description, and upon viewing the accompanying drawings.

DETAILED DESCRIPTION

Figure 1:
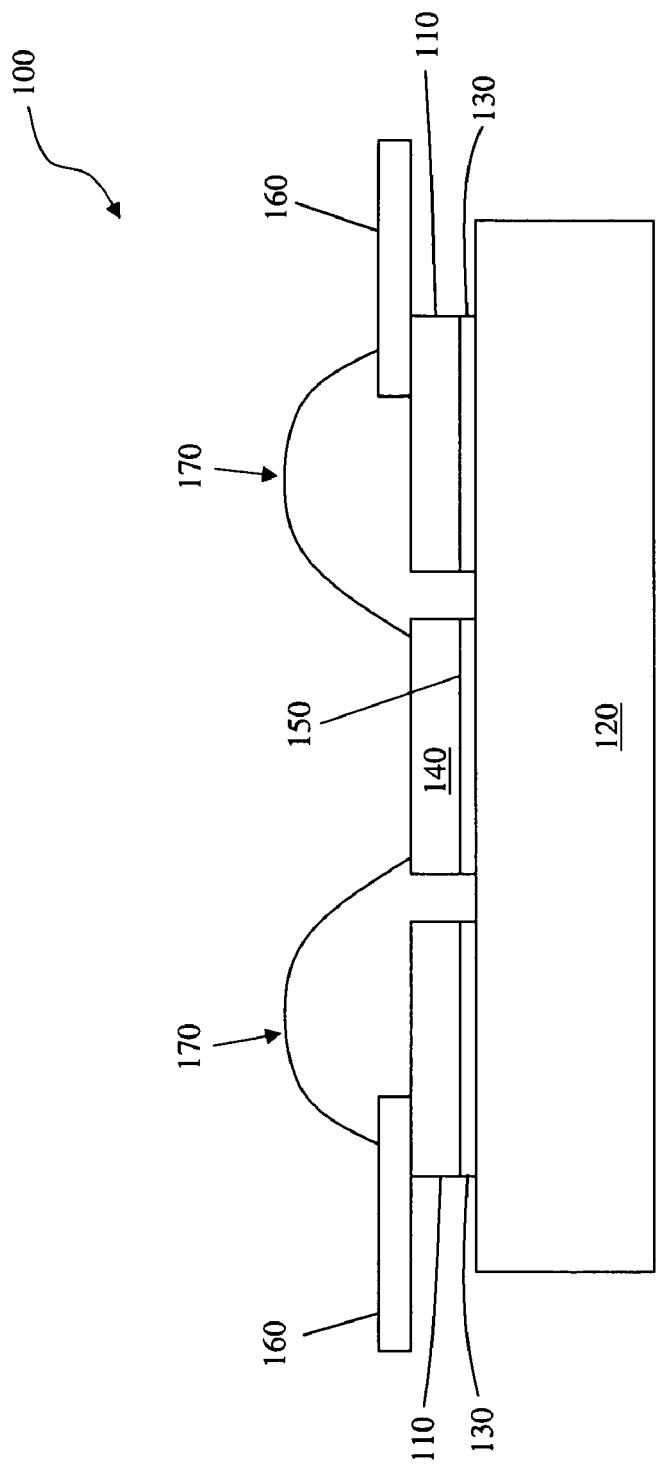
FIG. 1 illustrates an embodiment of a high power package including a ceramic lead frame and a semiconductor chip attached to a copper heat sink.

FIG. 1 illustrates an embodiment of a package 100 for high power applications. The high power package 100 includes a ceramic lead frame 110 such as an alumina lead frame attached to a copper heat sink 120. The ceramic lead frame 110 is attached to the copper heat sink 120 with an epoxy 130 instead of being brazed to the heat sink. The epoxy 130 typically cures at a temperature of about 275° C. or less which is significantly lower than brazing temperatures. Thus, the heat sink 120 can have a much higher copper content compared to conventional high power packages because damage caused by CTE mismatches between the lead frame 110 and the heat sink 120 is less of a concern at lower processing temperatures. In one embodiment, the copper heat sink 120 contains enough copper to provide a thermal conductivity of at least 350 W/mK. Thus, the copper heat sink 120 can be made from a copper alloy such as CU194, but still contain enough copper to provide sufficient heat transfer.

The high power package 100 also includes a semiconductor chip 140 attached to the copper heat sink 120 on the same side as the ceramic lead frame 110. The semiconductor chip 140 is attached to the copper heat sink 120 with an electrically conductive material 150 having a melting point of about 280° C. or greater. This way, the interface between the semiconductor chip 140 and the heat sink 120 remains in tact and reliable despite potentially high operating temperature conditions during use in the field. In one embodiment, the ceramic lead frame 110 at least partly surrounds the semiconductor chip 140. The ceramic lead frame 110 can be shaped like a rectangular or square window that surrounds the semiconductor chip 140 or can have any other desirable shape. Electrically conductive leads 160 can be attached to the ceramic lead frame 110. Bonding wires 170 can be provided to connect the electrically conductive leads 160 to the side of the semiconductor chip 140 facing away from the copper heat sink 120 for providing external signal and/or power connections to the semiconductor chip 140.

Even though high temperature brazing is not used to attach the ceramic lead frame 110 to the copper heat sink 120, the epoxy cure and chip attach processes are performed under conditions (temperatures, pressures, etc.) that can still cause the copper heat sink 120 to bow. The copper heat sink 120 bows because the CTE mismatch between the ceramic lead frame 110 and the heat sink 120 causes the heat sink 120 and lead frame 110 to expand and contract by different amounts. The amount of heat sink bowing is predictable in view of the package materials and assembly conditions. Thus, the heat sink 120 can be purposely bowed by a predetermined amount prior to package assembly for counteracting the bowing that occurs during assembly, yielding a generally planar heat sink after the semiconductor chip 140 is attached to the heat sink 120.

In one embodiment, the amount of predetermined bowing imparted to the copper heat sink 120 prior to assembly is a function of at least one of the thickness of the epoxy 130, the elasticity of the epoxy 130, the curing temperature of the epoxy 130, the thickness of the ceramic lead frame 110 and the thickness of the copper heat sink 120. For example, as the thickness of the epoxy 130 used to attach the ceramic lead frame 110 to the copper heat sink 120 increases, the amount of heat sink bowing that can result during the assembly process decreases. Also, higher values of the Young's Modulus of elasticity for the epoxy 130 results in an increased bowing of the copper heat sink 120. In addition, epoxies with relatively lower curing temperatures tend to minimize the bowing effect. Furthermore, a thinner heat sink 120 and lead frame 110 should provide more flexibility for reducing the heat sink bowing to an acceptable level. The heat sink bowing that does occur during package assembly is perpendicular to the surface of the heat sink 120 and can occur over both the length and width of the heat sink 120. The amount of bowing intentionally imparted on the copper heat sink 120 prior to assembly of the high power package 100 is predetermined to offset the counteracting bowing that occurs during assembly, and thus may include an opposing bowing over the length and width of the heat sink 120 in some embodiments.

Figure 2:
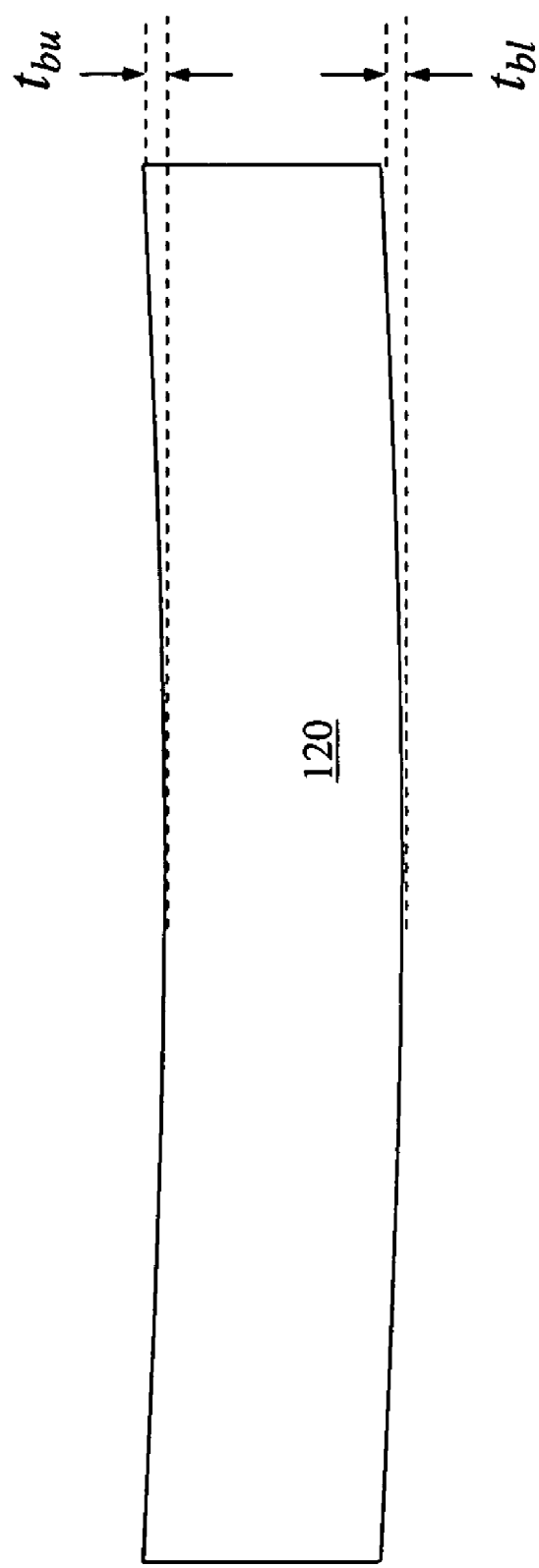
FIGS. 2-7 illustrate the high power package of FIG. 1 during different stages of manufacturing.

FIGS. 2-7 illustrate the high power package 100 during different stages of assembly. FIG. 2 illustrates a side view of the copper heat sink 120 after being bowed by a predetermined amount prior to the package 100 being assembled. The predetermined bow is selected to counteract the heat sink bowing that occurs during the assembly process so that the copper heat sink 120 is generally planar after the semiconductor chip 140 is attached to the heat sink 120. As described above, the amount of predetermined bow can be determined based on the conditions of the epoxy cure and chip attach processes and the characteristics of the heat sink 120 and ceramic lead frame 110. In another embodiment, sample or test copper heat sinks and ceramic lead frames are subjected to the package assembly process to empirically determine the amount of predetermined bowing needed to counteract the heat sink bowing that occurs during testing. In each case, the copper heat sink 120 is generally planar after the semiconductor chip 140 is attached to the heat sink 120.

In one embodiment, the copper heat sink 120 is intentionally bowed so that the side of the heat sink 120 to which the ceramic lead frame 110 and the semiconductor chip 140 are to be attached has a concave contour and the opposing side has a convex contour as shown in FIG. 2. Accordingly, the side of the copper heat sink 120 to which the ceramic lead frame 110 and the semiconductor chip 140 are to be attached is curved inwardly by an amount $t_{bu}$. The opposing side of the heat sink 120 is curved outwardly by an amount $t_{bl}$ where $t_{bu} \approx t_{bl}$. In one embodiment, the copper heat sink 120 is bowed a predetermined amount by stamping the heat sink 120 so that the side of the heat sink 120 to which the ceramic lead frame 110 and the semiconductor chip 140 are to be attached is curved inward and the opposing side is curved outward.

Figure 3:
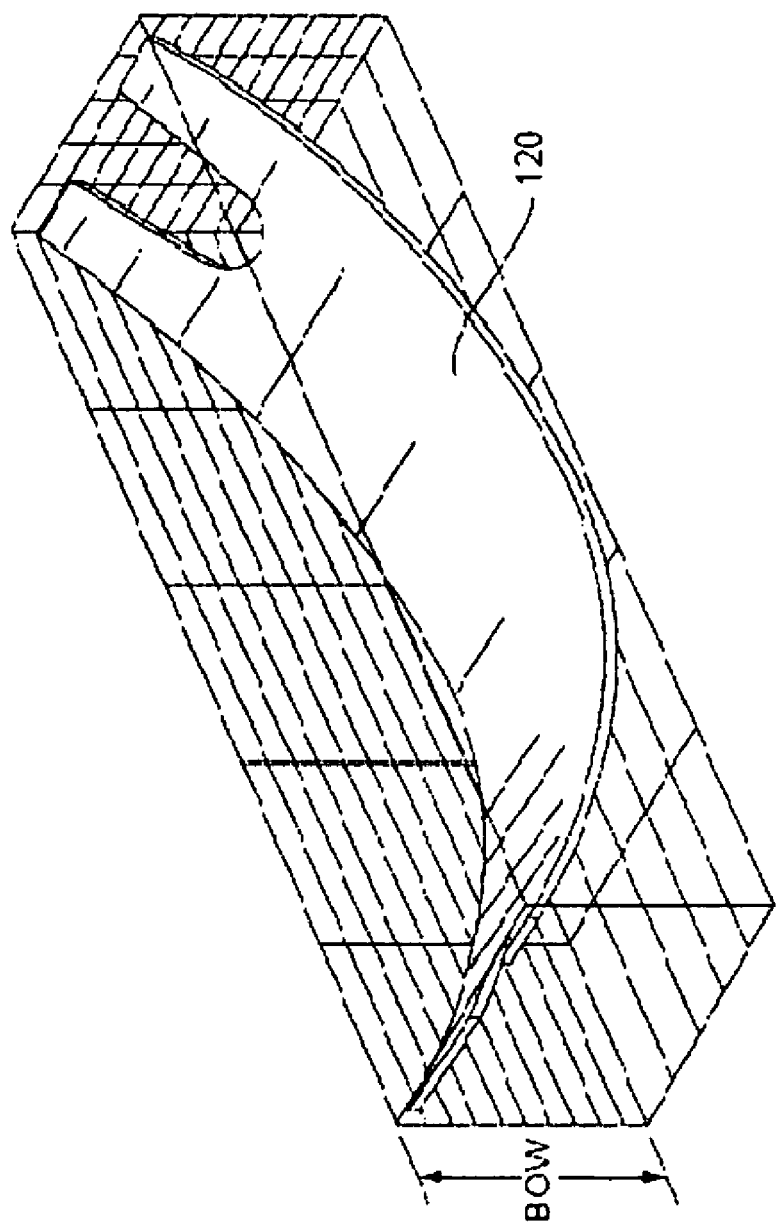

FIG. 3 illustrates a three-dimensional perspective view of an embodiment of the copper heat sink 120 after the heat sink 120 has been bowed a predetermined amount. The copper heat sink 120 can be bowed over its entire length and width as shown in FIG. 3. In one embodiment, the heat sink is approximately 1.340 inches long, 0.385 inches wide, 0.040 inches thick and intentionally bowed about 3 to 4 mils from end-to-end. The amount of bowing purposely imparted on the copper heat sink 120 is a function of several variables which can be modeled or empirically derived as described previously herein to determine the appropriate amount of heat sink bowing to impart.

Figure 4:
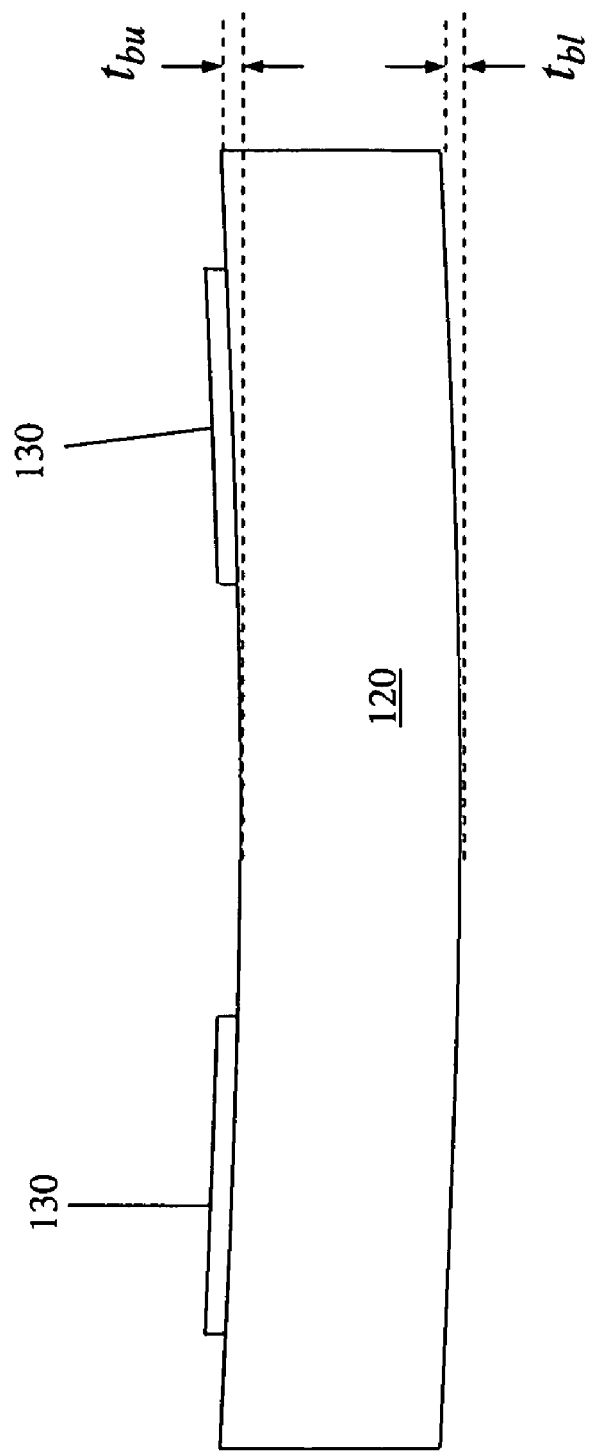

FIG. 4 illustrates a side view of the copper heat sink 120 after the epoxy 130 is deposited on the copper heat sink 120. In one embodiment, the epoxy 130 is a polyimide. Broadly, the epoxy 130 is deposited between the copper heat sink 120 and the ceramic lead frame 110. FIG. 4 shows an embodiment where the epoxy 130 is screen printed on the copper heat sink 120. Broadly, the epoxy 130 can be screen printed on the ceramic lead frame 110, the copper heat sink 120 or both. By screen printing the epoxy 130, the epoxy 130 can be patterned so that it is deposited on the copper heat sink 120 in those regions where the lead frame 110 is to be attached to the heat sink 120. In one embodiment, 2 to 5 mils of the epoxy 130 is screen printed on the ceramic lead frame 110, the copper heat sink 120 or both. A relatively thick 2 to 5 mil epoxy layer reduces the amount of bowing imparted on the copper heat sink 120 during the package assembly process. In another embodiment, the epoxy 130 can be applied to the entire surface of the heat sink 120 and subsequently patterned so that the remaining epoxy covers the region of the heat sink 120 to which the lead frame 110 is to be attached. In each case, a portion of the side of the copper heat sink 120 to which the ceramic lead frame 110 is to be attached is free from epoxy so that the semiconductor chip 140 can be attached to the same side of the heat sink 120 as the lead frame 110. The epoxy 130 is then cured to attach the ceramic lead frame 110 to the copper heat sink 120.

Figure 5:
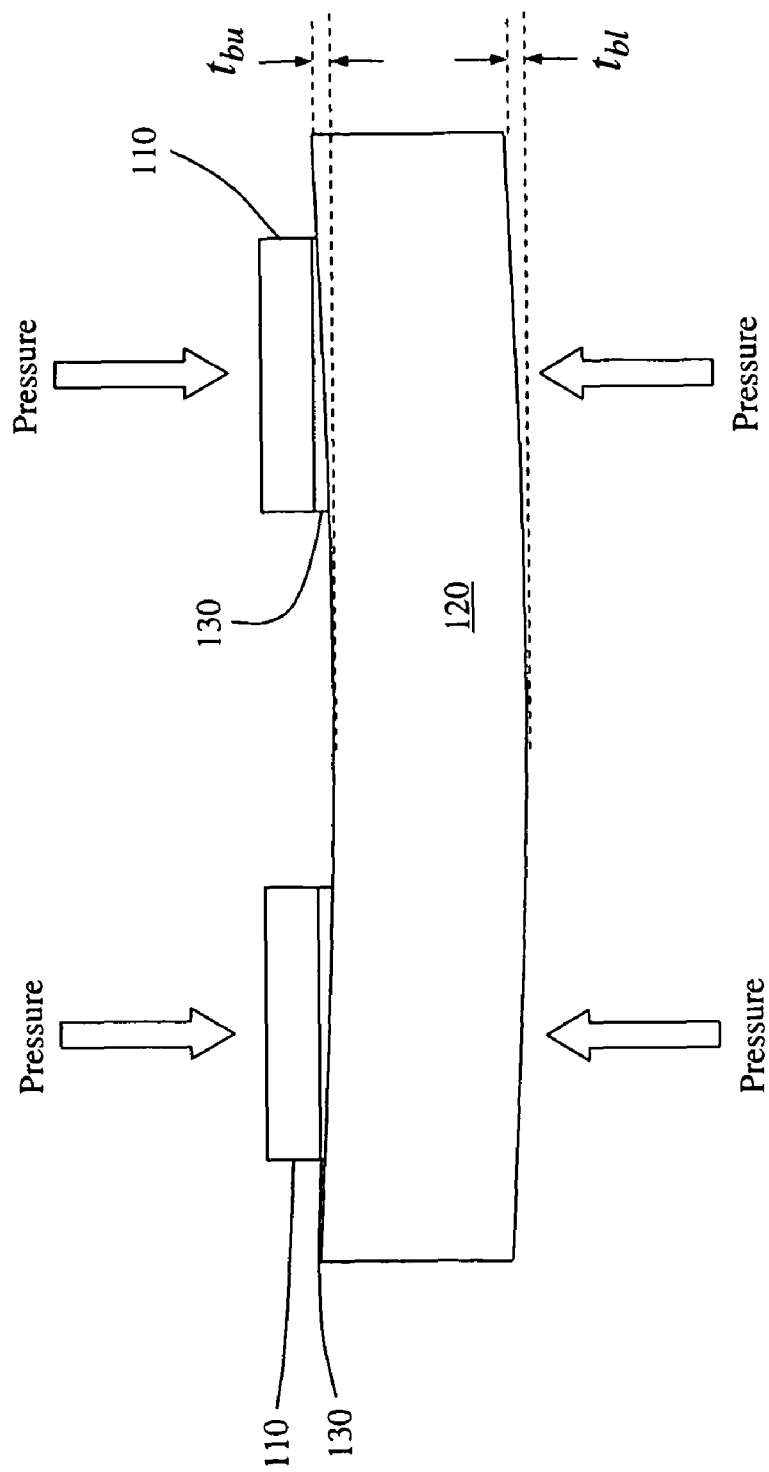

FIG. 5 illustrates a side view of the copper heat sink 120 and the ceramic lead frame 110 during epoxy curing. In one embodiment, the epoxy 130 is cured under pressure for about 30 minutes at approximately 150° C. and for about 30 minutes at approximately 275° C. The temperature of the epoxy curing process becomes high enough to cause some bowing of the copper heat sink 120. The amount of initial predetermined bowing purposely imparted to the heat sink 120 accounts for the epoxy cure conditions so that the counteracting bow that occurs when the copper heat sink 120 is attached to the ceramic lead frame 110 is corrected. Most of the heat sink bowing occurs during the chip attachment process which is performed at a higher temperature than the epoxy curing.

Figure 6:
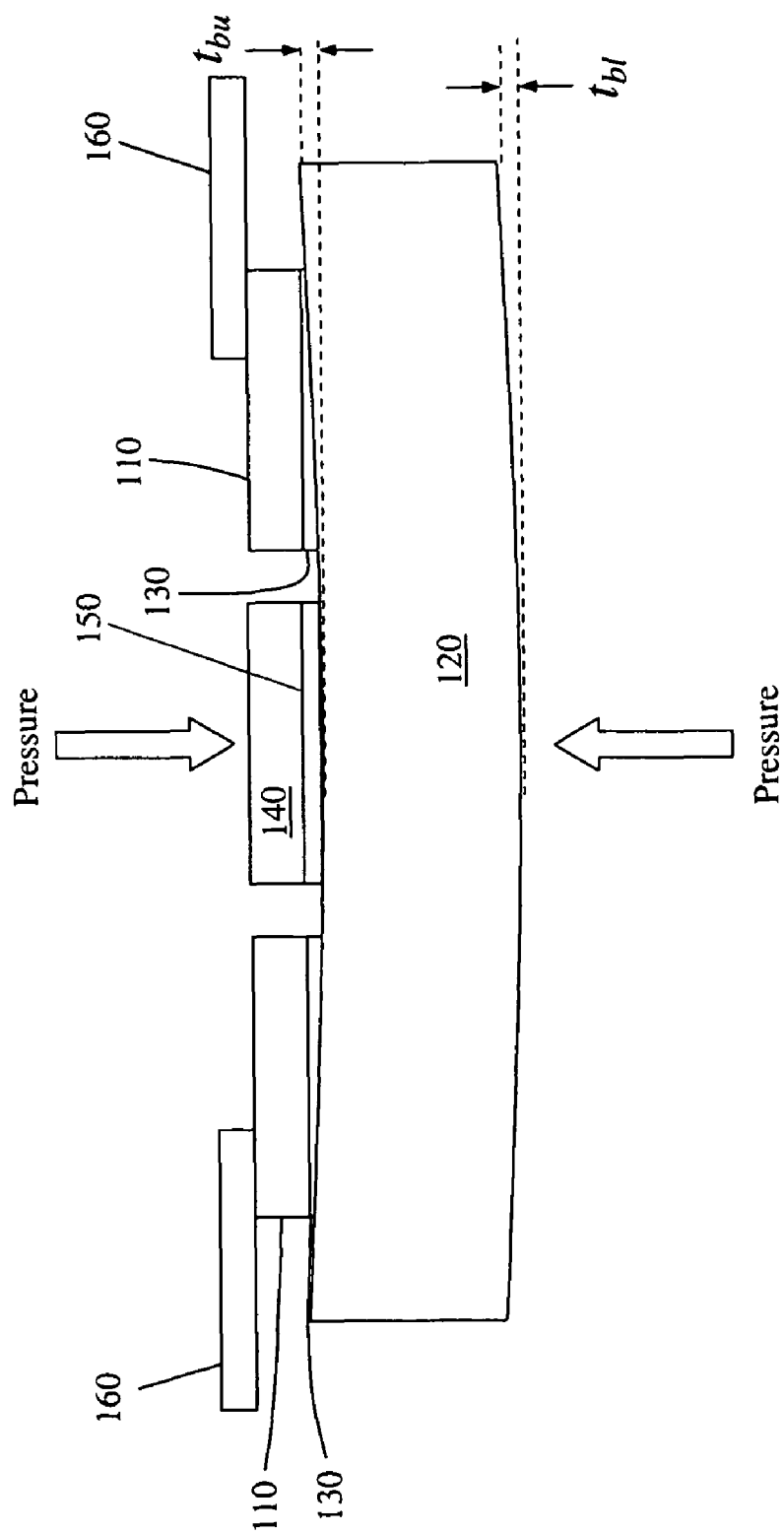

FIG. 6 illustrates a side view of the high power package 100 during the chip attachment process. FIG. 6 shows the electrically conductive leads 160 being attached to the ceramic lead frame 110 prior to or during the semiconductor chip 140 being attached to the copper heat sink 120. Alternatively, the electrically conductive leads 160 can be attached to the ceramic lead frame 110 after chip attach. In each case, the chip attach material 150 can be any electrically conductive material having a melting point of about 280° C. or greater such as AuSn, AuSi, AuGe, etc. This way, the interface between the semiconductor chip 140 and the heat sink 120 remains in tact and reliable despite high operating temperature conditions which can occur in the field. The semiconductor chip 140 is attached under temperature and pressure to the same side of the heat sink 120 as the ceramic lead frame 110. The epoxy 130 can withstand the chip attach temperatures which can reach approximately 320° C. for about 5 minutes, and thus does not break down under these conditions.

Figure 7:
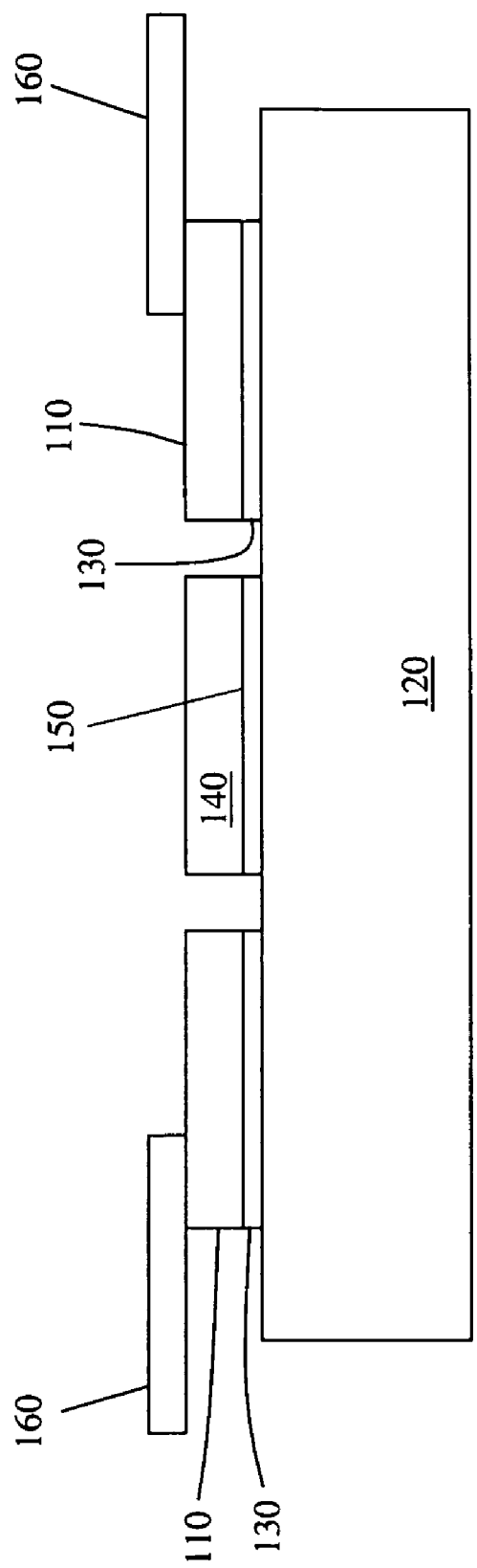

FIG. 7 illustrates a side view of the high power package 100 after the ceramic lead frame 110 and the semiconductor chip 140 are attached to the copper heat sink 120. The temperature of the chip attach process is high enough to cause a problematic amount of bowing to the copper heat sink 120. However, the amount of predetermined bowing intentionally imparted to the heat sink 120 prior to package assembly accounts for the chip attach conditions so that the counteracting bow imparted when the semiconductor chip 140 is attached to the heat sink 120 is corrected for. As such, the side of the copper heat sink 120 to which the ceramic lead frame 110 and the semiconductor chip 140 are attached is generally planar after the epoxy cure and chip is attach processes as shown in FIG. 7. Assembly of the high power package 110 can continue with the attachment of the bonding wires 170 as shown in FIG. 1. An optional lid (not shown) can be placed on the electrical leads 160, sealing the semiconductor chip 140 from the outside environment. The cavity created by the lid can be filled with a material (not shown) such as a silicon gel to provide a hermetic seal. The amount of initial predetermined bowing purposely imparted to the heat sink 120 prior to package assembly can also account for any heat sink bowing that may occur during any post-chip attach processes if the conditions associated with these assembly processes are extreme enough to cause heat sink bowing, thus correcting for such bowing.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a high power package, comprising:
    attaching a copper heat sink having a predetermined bow to a ceramic lead frame with an epoxy;
    attaching a semiconductor chip to the copper heat sink on the same side as the ceramic lead frame so that the ceramic lead frame at least partly surrounds the semiconductor chip; and
    wherein the ceramic lead frame and the semiconductor chip are attached to the copper heat sink under conditions that impart a bow on the copper heat sink which counteracts the predetermined bow so that the side of the copper heat sink attached to the ceramic lead frame becomes generally planar.

2. The method of claim 1, wherein some of the counteracting bow is imparted when the copper heat sink is attached to the ceramic lead frame.

3. The method of claim 1, wherein some of the counteracting bow is imparted when the semiconductor chip is attached to the copper heat sink.

4. The method of claim 1, comprising:
    depositing 2 to 5 mils of the epoxy between the copper heat sink and the ceramic lead frame; and
    curing the epoxy to attach the copper heat sink to the ceramic lead frame.

5. The method of claim 4, comprising screen printing the 2 to 5 mils of epoxy on the side of the copper heat sink to which the ceramic lead frame is to be attached.

6. The method of claim 4, comprising curing the epoxy for about 30 minutes at approximately 150° C. and for about 30 minutes at approximately 275° C.

7. A method of manufacturing a high power package, comprising:
    bowing a copper heat sink by a predetermined amount sufficient to counteract a bow imparted to the heat sink during subsequent processing so that the copper heat sink is generally planar after a ceramic lead frame and a semiconductor chip are attached to the heat sink;
    attaching the ceramic lead frame to the copper heat sink with an epoxy; and
    attaching the semiconductor chip to the same side of the copper heat sink as the ceramic lead frame.

8. The method of claim 7 wherein bowing the copper heat sink comprises inwardly curving the side of the copper heat sink to which the ceramic lead frame and the semiconductor chip are to be attached and outwardly curving the opposing side of the copper heat sink.

9. The method of claim 7 wherein bowing the copper heat sink comprises stamping the copper heat sink so that the side of the copper heat sink to which the ceramic lead frame and the semiconductor chip are to be attached is curved inward and the opposing side is curved outward.

10. The method of claim 7, comprising bowing the copper heat sink over the length and width of the copper heat sink.

11. The method of claim 7, wherein the predetermined amount of bowing is a function of at least one of a thickness of the epoxy, an elasticity of the epoxy, a curing temperature of the epoxy, a thickness of the ceramic lead frame and a thickness of the copper heat sink.

12. The method of claim 7, comprising:
    screen printing the epoxy on the ceramic lead frame, the copper heat sink or both; and
    curing the epoxy to attach the ceramic lead frame to the copper heat sink.

13. The method of claim 12, comprising screen printing 2 to 5 mils of the epoxy on the ceramic lead frame, the copper heat sink or both.

14. A method of manufacturing a high power package, comprising:
    providing a copper heat sink having a predetermined bow sufficient to counteract a bow imparted to the copper heat sink during subsequent processing so that the copper heat sink is generally planar after a ceramic lead frame and a semiconductor chip are attached to the copper heat sink;

attaching the ceramic lead frame to the copper heat sink with an epoxy; and attaching the semiconductor chip to the same side of the copper heat sink as the ceramic lead frame.

15. The method of claim 14, wherein the side of the copper heat sink to which the ceramic lead frame and the semiconductor chip are to be attached is curved inward and the opposing side of the copper heat sink is curved outward.

16. The method of claim 14, wherein the extent of predetermined bowing is a function of at least one of a thickness of the epoxy, an elasticity of the epoxy, a curing temperature of the epoxy, a thickness of the ceramic lead frame and a thickness of the copper heat sink.

17. The method of claim 14, comprising:

screen printing the epoxy on the ceramic lead frame, the copper heat sink or both; and curing the epoxy to attach the ceramic lead frame to the copper heat sink.

18. The method of claim 17, comprising screen printing 2 to 5 mils of the epoxy on the ceramic lead frame, the copper heat sink or both.

* * * * *